United States Patent [19]
Choi et al.

[11] Patent Number: 6,137,726
[45] Date of Patent: Oct. 24, 2000

[54] MULTI-LEVEL MEMORY DEVICES HAVING MEMORY CELL REFERENCED WORD LINE VOLTAGE GENERATIONS

[75] Inventors: Byeng-Sun Choi, Kyunggi-do; Young-Ho Lim, Kyungki-do, both of Rep. of Korea

[73] Assignee: Samsung Electronics Co., Ltd., Rep. of Korea

[21] Appl. No.: 09/198,705

[22] Filed: Nov. 24, 1998

[30] Foreign Application Priority Data

Nov. 25, 1997 [KR] Rep. of Korea ................ 97-62867
Mar. 30, 1998 [KR] Rep. of Korea ................ 98-10992
Nov. 5, 1998 [KR] Rep. of Korea ................ 98-47374

[51] Int. Cl.$^7$ ................................................. G11C 16/04
[52] U.S. Cl. ................................. 365/185.24; 365/210
[58] Field of Search .................. 365/185.24, 185.03, 365/185.19, 185.2, 189.09, 189.11, 210, 226

[56] References Cited

U.S. PATENT DOCUMENTS

| | | | |
|---|---|---|---|
| 5,457,650 | 10/1995 | Sugiura et al. | 365/184 |
| 5,642,312 | 6/1997 | Harari | 365/185.33 |
| 5,748,534 | 5/1998 | Dunlap et al. | 356/185.21 |
| 5,761,132 | 6/1998 | Kim | 365/189.05 |
| 5,768,188 | 6/1998 | Park et al. | 365/185.03 |
| 5,768,191 | 6/1998 | Choi et al. | 365/185.22 |
| 5,815,436 | 9/1998 | Tanaka et al. | 365/185.03 |

*Primary Examiner*—David Nelms
*Assistant Examiner*—Anh Phung
*Attorney, Agent, or Firm*—Myers Bigel Sibley & Sajovec

[57] ABSTRACT

A plurality of memory cell referenced regulators is connected to an output terminal that is configured to connect to a plurality of memory cells of a multi-level memory device. A respective one of the memory cell referenced regulators includes a respective dummy memory cell having a respective predetermined threshold voltage. The plurality of memory cell referenced regulators are responsive to a select signal such that a selected one of the memory cell referenced regulators varies a current at the output terminal to maintain the output terminal at a voltage proportional to the threshold voltage of the dummy memory cell of the selected memory cell referenced regulator. Each of the memory cell referenced regulators may comprise a variable current mirror having a controlled current path and an output current path including the output terminal. The controlled current path includes a controlled impedance therein that provides a variable impedance responsive to a control voltage applied thereto such that current produced at the output terminal is proportional to current in the controlled current path. A control voltage generator is connected between the output terminal and the controlled impedance and includes a dummy memory cell having a predetermined threshold voltage. The control voltage generator is operative to apply a control voltage to the controlled impedance to vary a current at the output terminal when an output voltage at the output terminal is greater than a predetermined voltage proportional to the predetermined threshold voltage of the dummy memory cell.

26 Claims, 7 Drawing Sheets

Fig. 8

MULTI-LEVEL MEMORY DEVICES HAVING MEMORY CELL REFERENCED WORD LINE VOLTAGE GENERATIONS

FIELD OF THE INVENTION

The present invention relates to memory devices, and more particularly, to multi-level memory devices.

BACKGROUND OF THE INVENTION

A memory cell array of, for example, a read-only memory (ROM), typically includes a plurality of memory cells arranged in rows and columns. Word lines typically extend along and are connected to the rows of the memory cells, while bit lines extend along and are connected to the columns of the memory cells. Typically, each memory cell comprises a transistor, e.g., a floating gate transistor, having a gate electrode connected to a word line, a source electrode connected to a signal ground, and a drain electrode connected to a bit line. To read data from a selected memory cell, the bit line to which the selected memory cell is connected to a sense amplifier and a word line to which the selected memory cell is connected is driven by a word line voltage.

Traditional signal-bit ROM memory cells include a transistor having a threshold voltage that is set at one of two levels so that the memory cell stores one bit of data. To store more data, "multi-level" (or "multi-bit") devices have been proposed that utilize more than two threshold voltage levels to allow a signal memory cell to store multiple bits of data.

Various types of multi-level memories are possible. In one type, the gate length or gate width of the transistor of each memory cell is varied so that the current flowing when the memory cell is accessed may be set at various values. In other types of multilevel memories, the quantity of impurity ions injected into the metal oxide semiconductor (MOS) transistor of each memory cell is varied so that the threshold voltage of the MOS transistor may be set at various values.

Figure 1:
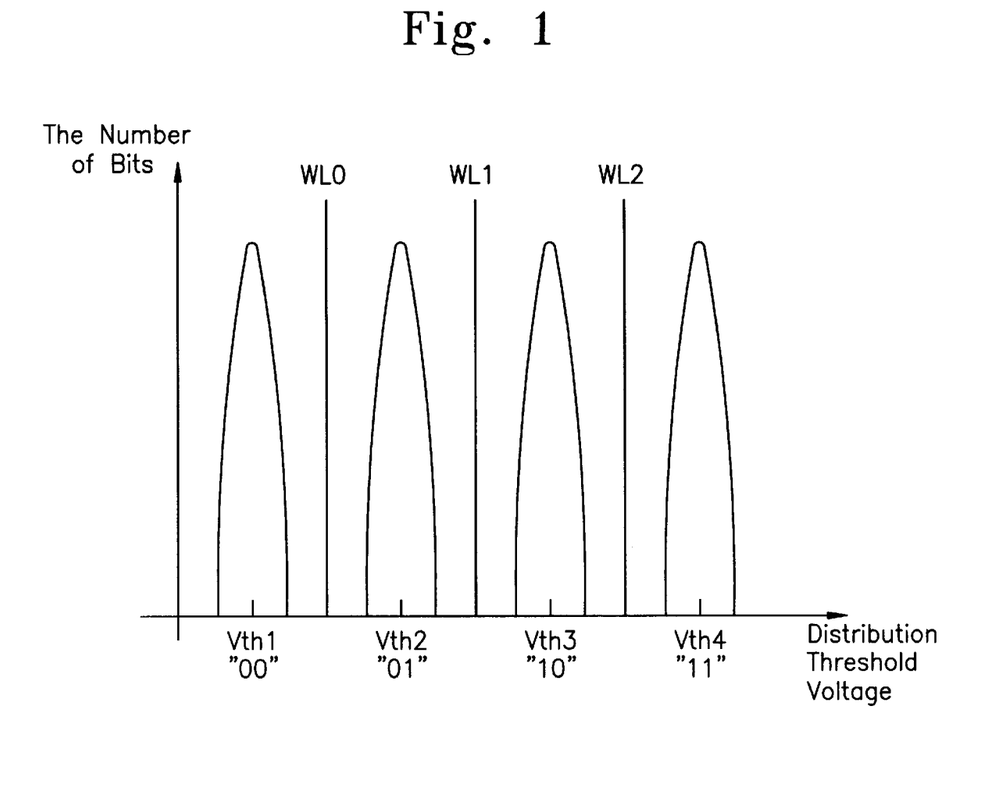
FIG. 1 illustrates relationship between word line voltages and threshold voltage distributions among a plurality of memory cells in a multi-level memory.

FIG. 1 illustrates relationships between predetermined word line voltage thresholds WL0–WL1 and threshold voltage distributions Vth1–Vth4 for a multi-bit ROM. Each memory cell of multi-bit ROM may be classified as having one of four logic states 00–11, based on the relationship of its threshold voltage to the word line voltage level thresholds WL0–WL1.

Figure 2:
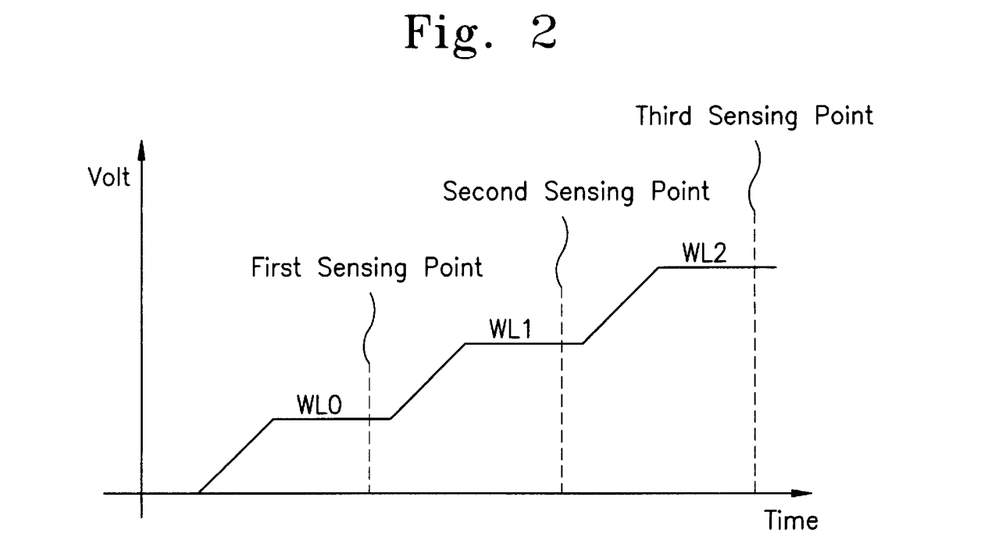
FIG. 2 illustrates a word line voltage waveform applied to a multi-bit memory cell during a data reading operation.
Figure 3:
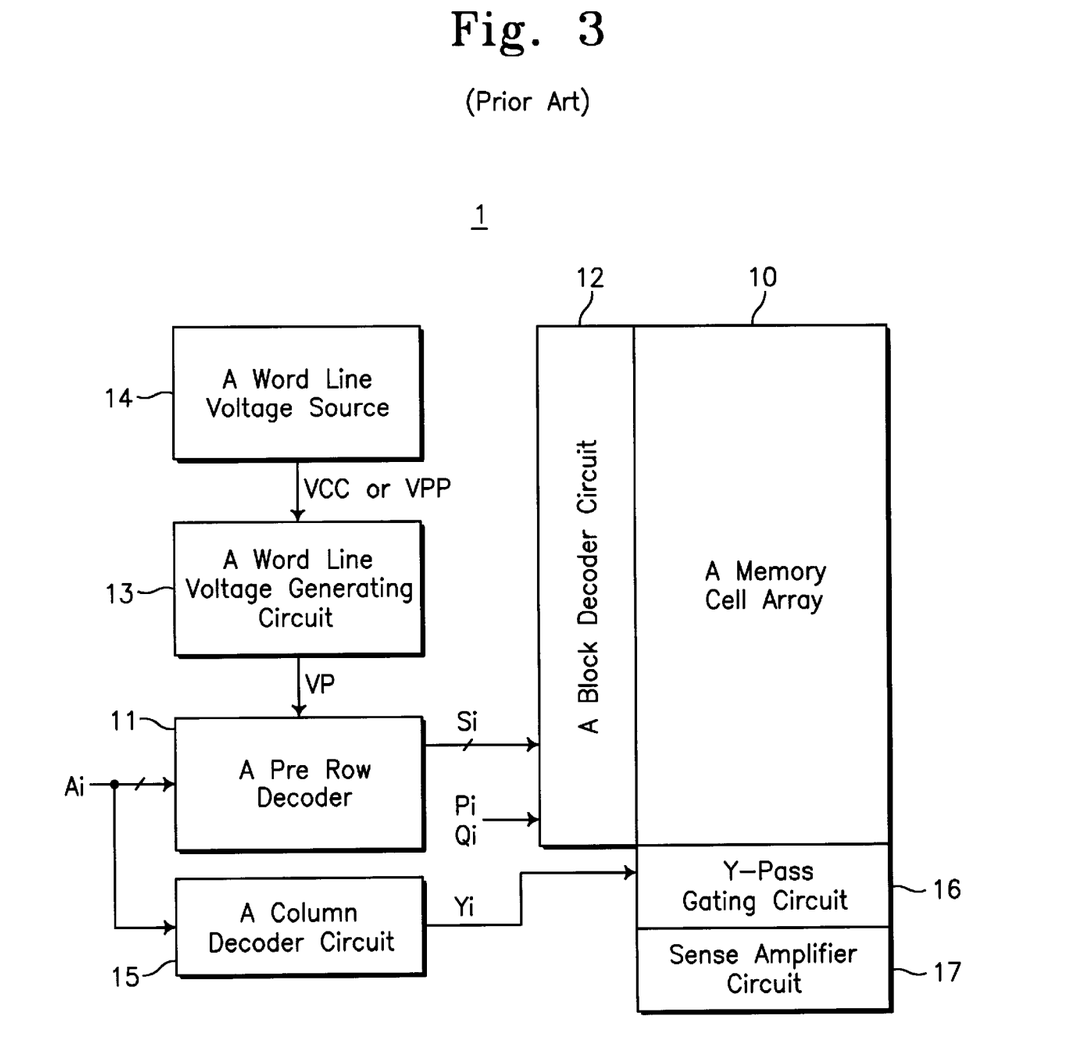
FIG. 3 is a schematic diagram of a multi-level memory device.

FIG. 2 is a diagram showing reference voltages applied to a word line in a memory device such as the memory device 1 illustrated in FIG. 3 during a data reading operation for a multi-bit memory cell. While the word line is driven at a first word line voltage WL0, a sense amplifier circuit 17 detects whether a current (cell current) flows through the selected memory cell. Next, a second word line voltage WL1 higher than the first word line voltage WL0 is applied to the word line while the sense amplifier 17 determines whether a cell current flows through the selected memory cell. A third word line voltage WL2 higher than the first and second word line voltages WL0, WL1 is then applied to the word line while the sense amplifier determines whether a cell current flows through the memory device. As is known to those skilled in the art, the word line voltage at which the memory cell begins to exhibit current flow indicates the logic state of the memory cell. Generally, it is very important that the word line voltages WL0–WL2 are precisely controlled to prevent data sensing errors.

A typical multi-level memory device 1, illustrated in FIG. 3, includes an array 10 of multi-bit memory cells connected to word lines and bit lines (not shown). The word lines are selected by a pre row decoder circuit 11 and a block decoder circuit 12 in response to an address Ai applied thereto. A word line voltage generating circuit 13 generates a word line voltage VP and applies it to a selected word line via the pre-row decoding circuit 11 and the block decoder circuit 12. The voltage VP has different voltage levels, for example, the word line voltages WL0, WL1, WL2 illustrated in FIG. 2. The word line voltage generating circuit 13 receives a power supply voltage VCC/VPP from a voltage source 14, and generates the word line voltage VP therefrom. A bit line of the array 10 is selected by a column decoder circuit 15 and a column pass gating circuit 16, and a sense amplifier circuit 17 connected to the selected bit line detects whether a cell current flows in a memory cell connected to the selected bit line.

Figure 4:
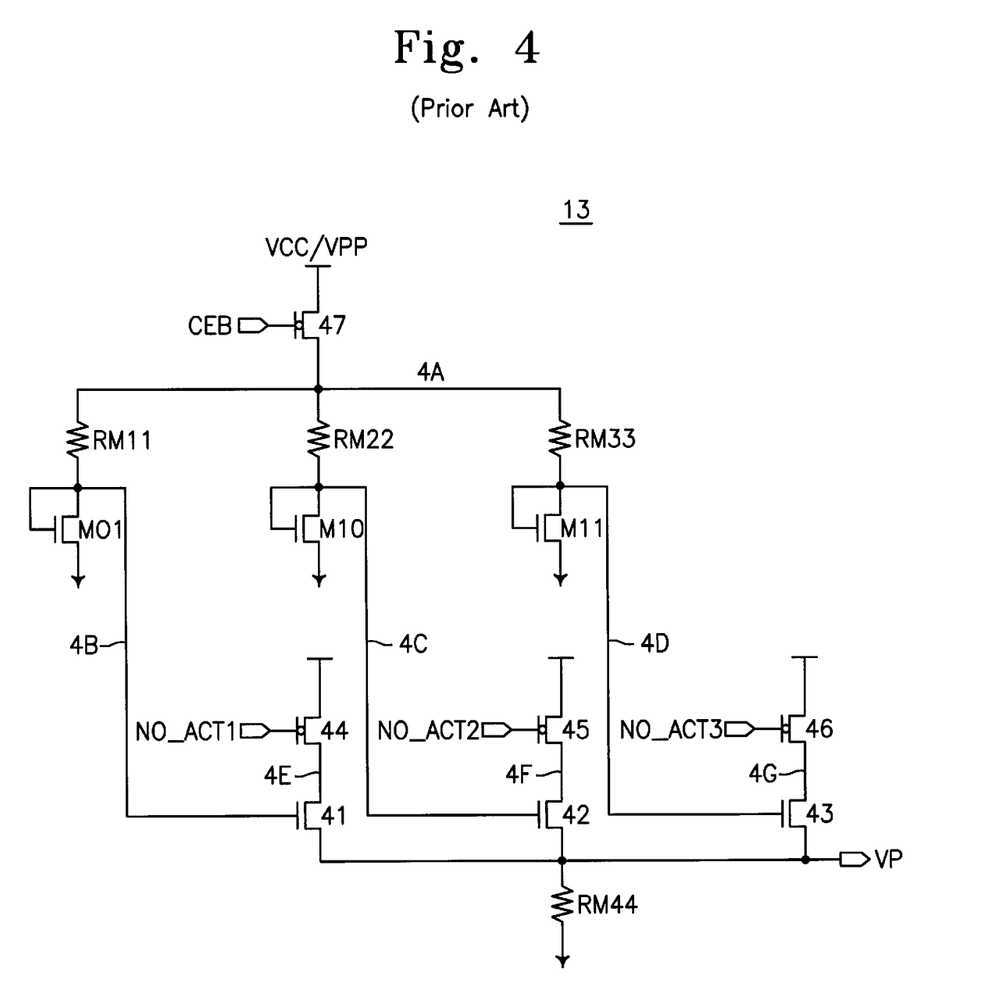
FIG. 4 is a schematic diagram illustrating a conventional word line voltage generating circuit for a multi-level memory device.

A conventional word line voltage generating circuit 13 for use in the memory device 1 of FIG. 3 and described in U.S. Pat. No. 5,457,650 is depicted in FIG. 4. The word line voltage generating circuit 13 has three dummy cells M001, M10, M11, each comprising an NMOS transistor. The sources of the dummy cells M01, M10, M11 are grounded and their drains and gates are connected to a PMOS transistor 47 through resistors RM11, RM22, RM33. The gate of the transistor 47 receives a signal CEB, while the source of the transistor 47 receives a power supply voltage VCC/VPP. The drains of the dummy cells M01, M10, M11 are connected to the gates of NMOS transistors 41, 42 and 43, respectively. The sources of the transistors 41, 42 and 43 are grounded through a resistor RM44, and the drains of the transistors 41, 42 and 43 are connected to the drains of PMOS transistors 44, 45, 46, respectively. The gates of the transistors 44, 45, 46 receive signals NO_ACT1, NO_ACT2, NO_ACT3, and their sources receive the power supply voltage VCC/VPP. An output voltage VP is produced at an output node connected to the sources of the transistors 41, 42, 43 and the resistor RM44.

The resistors RM11, RM22, RM33 typically have high resistances. The transistors 41, 42, 43 are typically enhancement-mode devices having threshold voltages that are nearly equal to 0V. When the signal CEB supplied to the gate of the PMOS transistor 47 is at a low level, the voltage at a node 4B is limited at approximately the threshold voltage of the dummy cell transistor M01, as the dummy transistor conducts when the voltage at node 4B rises above a threshold voltage of the dummy cell transistor M01. Similarly, the voltage at a node 4C is limited at approximately the threshold voltage of the dummy cell transistor M10 and the voltage at a node 4D is limited at approximately the threshold voltage of the dummy cell transistor M11.

Enhancement mode transistors 41, 42, 43 typically have threshold voltages nearly equal to 0V. When a first select signal NO_ACT1 applied to a first transistor 44 is asserted low, the output voltage VP is approximately the same as the threshold voltage of the dummy cell transistor M01 (i.e., the voltage at a node 4B). When a second select signal NO_ACT2 is asserted low, the output voltage VP is approximately the same as the threshold voltage of the dummy cell transistor M10. When a third select signal NO_ACT3 is asserted low, the output voltage VP is approximately the same as the threshold voltage of the dummy cell transistor M11. As the output voltage VP of the word line generating circuit 13 is applied by the pre row decoder circuit 11 to a selected word line of the cell array 10.

The above-described word line voltage generating circuit 13 can compensate for upward fluctuation of the output voltage VP due, for example, to fluctuations in the power supply voltage VCC/VPP or to variations in the characteristics of memory cells driven by the word line voltage generating circuit 13. However, the word line voltage generating circuit 13 typically cannot boost the output voltage VP above the selected threshold voltage, as the threshold voltages of the dummy cells M01, M10, M11 are typically fixed. In addition, the threshold voltages of the transistors 41, 42, 43 may vary, causing variation in the output voltage VP. Moreover, if the source voltages of the transistors 41, 42, 43 are altered, their threshold voltages typically change due to a "body effect" well known to those skilled in the art. Since the source voltages of the transistors 41, 42, 43 are different for each sensing voltage level applied, the amount of the threshold voltage variation of each transistor 41, 42, 43 also typically differs. This may reduce the sensing margin for the sense amplifier circuit, and thus may reduce data sensing reliability of the memory device.

SUMMARY OF THE INVENTION

In light of the foregoing, it is an object of the present invention to provide word line voltage generating apparatus for multi-level memory devices that provide stable and accurate word line voltages.

This and other objects, features and advantages are provided according to the present invention by word line voltage generators that include a plurality of memory cell referenced regulators that include a dummy memory cell having a predetermined threshold voltage and which vary a current at an output terminal to maintain the output terminal at a voltage proportional to the threshold voltage of the dummy memory cell. The current at the output terminal may be controlled by a variable current mirror circuit that includes the output terminal in a first current path and a controlled impedance in a second controlled current path that is responsive to a control voltage that is generated by the dummy memory cell. The dummy memory cell may be directly connected to the output terminal, or may be coupled to the output terminal via a capacitor or a voltage divider.

In particular, according to the present invention, an apparatus for generating word line voltages for a multi-level memory device comprises a plurality of memory cell referenced regulators connected to an output terminal that is configured to connect to a plurality of memory cells of the memory device. A respective one of the memory cell referenced regulators includes a respective dummy memory cell having a respective predetermined threshold voltage. The plurality of memory cell referenced regulators are responsive to a select signal and an output voltage at the output terminal such that a selected one of the memory cell referenced regulators varies a current at the output terminal to maintain the output voltage at a voltage proportional to the threshold voltage of the dummy memory cell of the selected memory cell referenced regulator.

Each of the memory cell referenced regulators may comprise a variable current mirror having a controlled current path and an output current path including the output terminal. The controlled current path includes a controlled impedance therein that provides a variable impedance responsive to a control voltage applied thereto such that current produced at the output terminal is proportional to current in the controlled current path. A control voltage generator is connected between the output terminal and the controlled impedance and includes a dummy memory cell having a predetermined threshold voltage. The control voltage generator is operative to apply a control voltage to the controlled impedance to vary a current at the output terminal when an output voltage at the output terminal is greater than a predetermined voltage proportional to the predetermined threshold voltage of the dummy memory cell. The controlled impedance may comprise a transistor having first and second controlled electrodes in the controlled current path and a control electrode connected to the memory cell biased control voltage generator.

The control voltage generator may include a dummy memory cell transistor having a control electrode electrically coupled to the output terminal and a controlled electrode connected to the controlled impedance. The dummy memory cell is operative to vary a control voltage applied to the controlled impedance when a voltage at the control electrode is greater than the predetermined threshold voltage. In one embodiment, a control electrode of the dummy memory cell is directly connected to the output terminal. In a second embodiment, a capacitor couples the control electrode of the dummy memory cell transistor and the output terminal. In a third embodiment, a first resistor couples the control electrode of the dummy memory cell transistor to the output terminal, and a second resistor couples the control electrode of the dummy memory cell transistor to a signal ground, thus providing a voltage divided version of the output voltage at the output terminal to the control electrode of the dummy memory cell.

According to another aspect of the present invention, the variable current mirror comprises a first transistor having a first controlled electrode connected to the controlled impedance, a second controlled electrode, and a control electrode, and a second transistor having a control electrode connected to the control electrode of the first transistor, a first controlled electrode connected to the output terminal, and a second controlled electrode connected to the second controlled electrode of the first transistor. Each of the memory cell referenced regulators further comprises a first switch, e.g., a first transistor, connected in series with the first and second controlled electrodes of the first transistor and with the controlled impedance and operative to allow and prevent current flow in the controlled current path responsive to an select signal applied thereto, and a second switch, e.g., a second transistor, connected between the first and the second controlled electrodes of the first transistor and operative to enable and disable operation of the current mirror circuit responsive to the select signal. A third switch, e.g., a third transistor, may be connected between the output terminal and a signal ground and operative to allow and prevent current flow from the word line voltage generator to the plurality of memory cells responsive to a reset signal applied thereto.

A multi-level memory device according to the present invention includes a plurality of memory cells, each of the memory cells having a programmable threshold voltage such that the cell produces a current in response to a word line voltage applied thereto. A word line voltage generator includes a plurality of memory cell referenced regulators coupled to an output terminal, a respective one of the memory cell referenced regulators including a respective dummy memory cell having a respective predetermined threshold voltage. The plurality of memory cell referenced regulators are responsive to a select signal and an output voltage at the output terminal such that a selected one of the memory cell referenced regulators varies a current at the output terminal to maintain the output voltage at a voltage proportional to the threshold voltage of the dummy memory cell of the selected memory cell referenced regulator. A word line decoder is operative to connect the output terminal of the word line voltage generator to a memory cell of the plurality of memory cells.

Each of the memory cell referenced regulators may comprise a variable current mirror having a controlled current path and an output current path including the output terminal, the controlled current path having a controlled impedance therein that provides a variable impedance responsive to a control voltage applied thereto such that current produced at the output terminal is proportional to current in the controlled current path. A control voltage generator may be connected between the output terminal and the controlled impedance and includes a dummy memory cell having a predetermined threshold voltage. The control voltage generator is operative to apply a control voltage to the controlled impedance to vary a current at the output terminal when an output voltage at the output terminal is greater than a predetermined voltage proportional to the predetermined threshold voltage of the dummy memory cell.

According to yet another aspect of the present invention, a memory cell referenced regulator for producing a read voltage for a multi-level memory device includes a dummy memory cell having a predetermined threshold voltage. Means are provided, responsive to a select signal and to an output voltage at an output terminal, for varying a current at said output terminal such that the output voltage is maintained at a voltage proportional to the threshold voltage of said dummy memory cell. The memory cell referenced regulator may comprise a variable current mirror having a controlled current path and an output current path including an output terminal, the controlled current path having a controlled impedance therein that provides a variable impedance responsive to a control voltage applied thereto such that current produced at the output terminal is proportional to current in the controlled current path. A control voltage generator may be connected between the output terminal and the controlled impedance and includes a dummy memory cell having a predetermined threshold voltage. The control voltage generator is operative to apply a control voltage to the controlled impedance to vary a current at the output terminal when an output voltage at the output terminal is greater than a predetermined voltage proportional to the predetermined threshold voltage of the dummy memory cell. Improved word line voltage generation for a multi-level memory device may thereby be provided.

DETAILED DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 5:
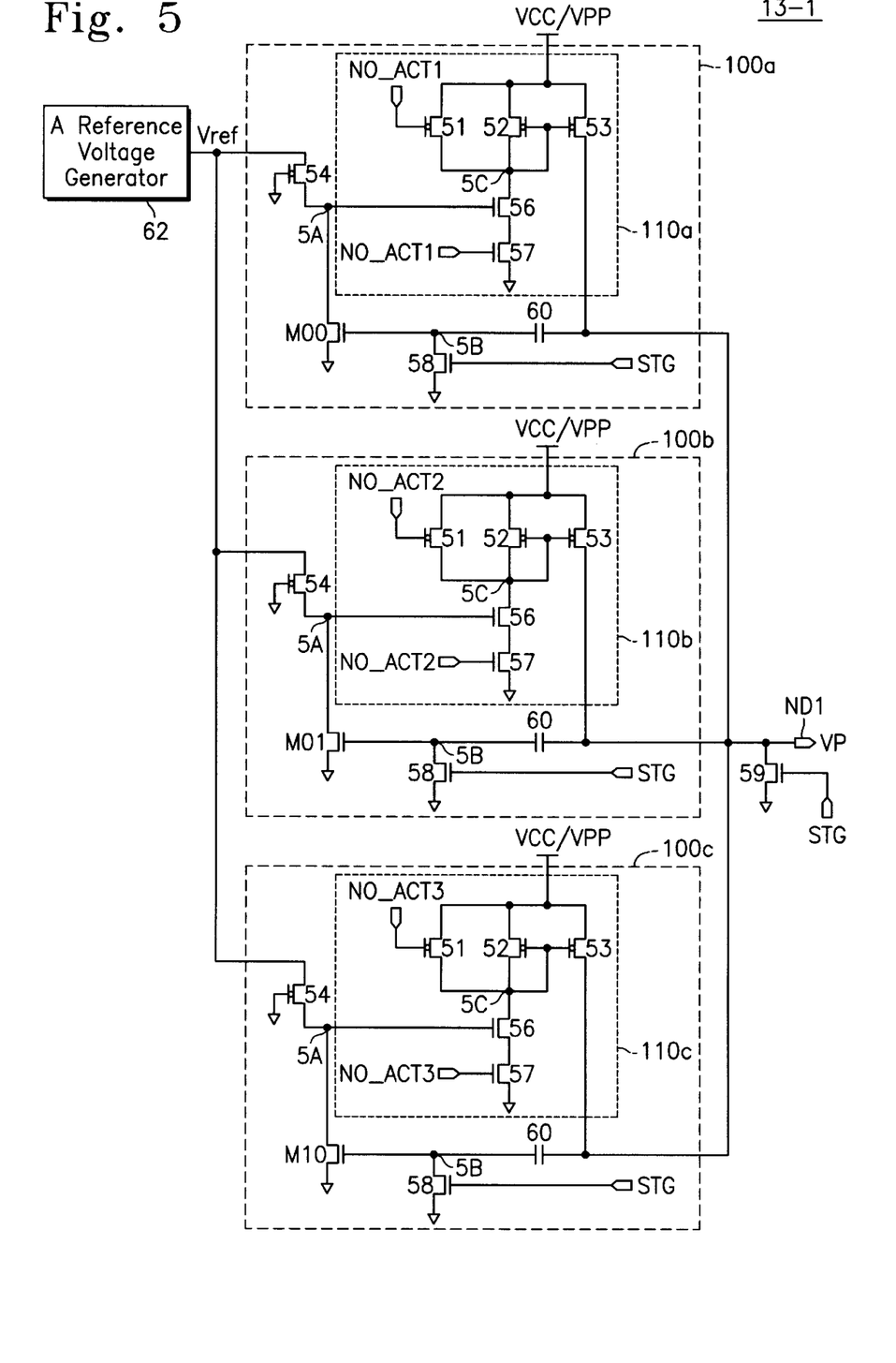
FIG. 5 is a schematic diagram illustrating a word line voltage generator according to a first embodiment of the present invention.

FIG. 5 illustrates a word line voltage generator 13-1 for use in a multilevel memory device, such as the memory device 1 of FIG. 3, according to a first embodiment of the present invention. The word line voltage generator 13-1 utilizes three dummy memory cells M00, M01, M10 having respective threshold voltages Vth1, Vth2, Vth3 as references for generating a word line voltage VP at an output terminal ND1 of various levels. The word line voltage generator 13-1 includes a reference voltage generator 62 and a plurality of memory cell referenced regulators 100a, 100b, 100c, a selected one of which regulates the output voltage VP at the output terminal ND1 responsive to select signals NO_ACT1, NO_ACT2, NO_ACT3. The reference voltage generator 62 generates a reference voltage Vref of a substantially constant level, for example, approximately 2V, and supplies the regulators 100a, 100b, 100c with the reference voltage Vref.

Each of the memory cell referenced regulators 100a, 100b, 100c receives a power supply a voltage VCC/VPP, for example, from the voltage source 14 of FIG. 3. The output terminal ND1 is discharged through an NMOS transistor 59 that acts as a switch for connecting and disconnecting the output terminal ND1 from the output terminal ND1 responsive to a reset signal STG. The first memory cell referenced regulator 100a generates an output voltage VP at a first voltage level responsive to a first select signal NO_ACT1, with the first voltage level being controlled based on a first threshold voltage Vth1 of a first dummy memory cell M00, e.g., a memory cell transistor such as those utilized in the memory cell array to which the word line voltage generator 13-1 is connected. Similarly, the second regulator 100b generates a second voltage level that is regulated based on a second voltage threshold Vth2 of a second dummy memory cell M01, responsive to a second select signal NO_ACT2. The third regulator 100c generates a third voltage level that is based on a third threshold voltage Vth4 of a third dummy memory cell M10, responsive to a third select signal NO_ACT3.

Each of the memory cell referenced regulators 100a, 100b, 100c includes a variable current mirror 110a, 110b, 110c that is operatively associated with a control voltage generator 115a, 115b, 115c. Each variable current mirror 110a, 110b, 110c includes two PMOS transistors 52, 53 having their source and gate electrodes connected together in a current mirror configuration. Each of the current mirrors 110a, 110b, 110c includes a controlled current path including a controlled impedance, e.g., an NMOS transistor 56, that controls current in a second current path that includes the output terminal ND1, thus providing regulation of the output voltage VP at the output terminal ND1. A PMOS transistor 54 couples the current mirror 110a, 110b, 110c and the reference voltage generator 62, and preferably has a current driving capacity that less than that of the dummy memory cell M00, M01, M10, to provide pre-charging of the gate of the controlled impedance transistor 56 of the current mirror node 110a, 110b, 110c, at a node 5A.

Another PMOS transistor 51 is connected across the gate and source electrodes of one of the PMOS current mirror transistors 52 and is operative to serve as a switch for disabling and enabling operation of the current mirror circuit 110a, 110b, 110c responsive to the select signal NO_ACT1, NO_ACT2, NO_ACT3, which is also applied to an NMOS transistor 57 which serves as a switch in the controlled current path of the current mirror 110a, 110b, 110c. When a reset signal STG is held "low", allowing the output terminal ND1 to float above a signal ground, one of the select signals NO_ACT1, NO_ACT2, NO_ACT3 is activated "high" to activate a selected one of the memory cell referenced regulators 100a, 100b, 100c by enabling operation of one of the variable current mirrors 110a, 110b, 110c to produce a regulated output voltage at the output terminal ND1 that is proportional to the threshold voltage of the associated dummy memory cell M00, M01, M10.

A respective one of the control voltage generators 115a, 115b, 115c includes a respective dummy memory cell M00, M01, M10 having a respective threshold voltage Vth1, Vth2, Vth3, and a control electrode (gate) connected to one end of a capacitor 60. One controlled electrode (source/drain) of the dummy memory cell M00, M01, M10 is grounded, while the other controlled electrode is connected to reference voltage generator 62 through the PMOS transistor 54. The other end of the capacitor 60 is tied to the output terminal ND1. Another NMOS transistor 58 has a first controlled electrode connected to the control electrode of the dummy memory cell M00, M01, M10, a second controlled electrode connect to a signal ground, and a control electrode that receives the reset signal STG, and thus acts to ground the gate of the dummy memory cell M00, M01, M10 when the reset signal STG is "high."

Figure 6:
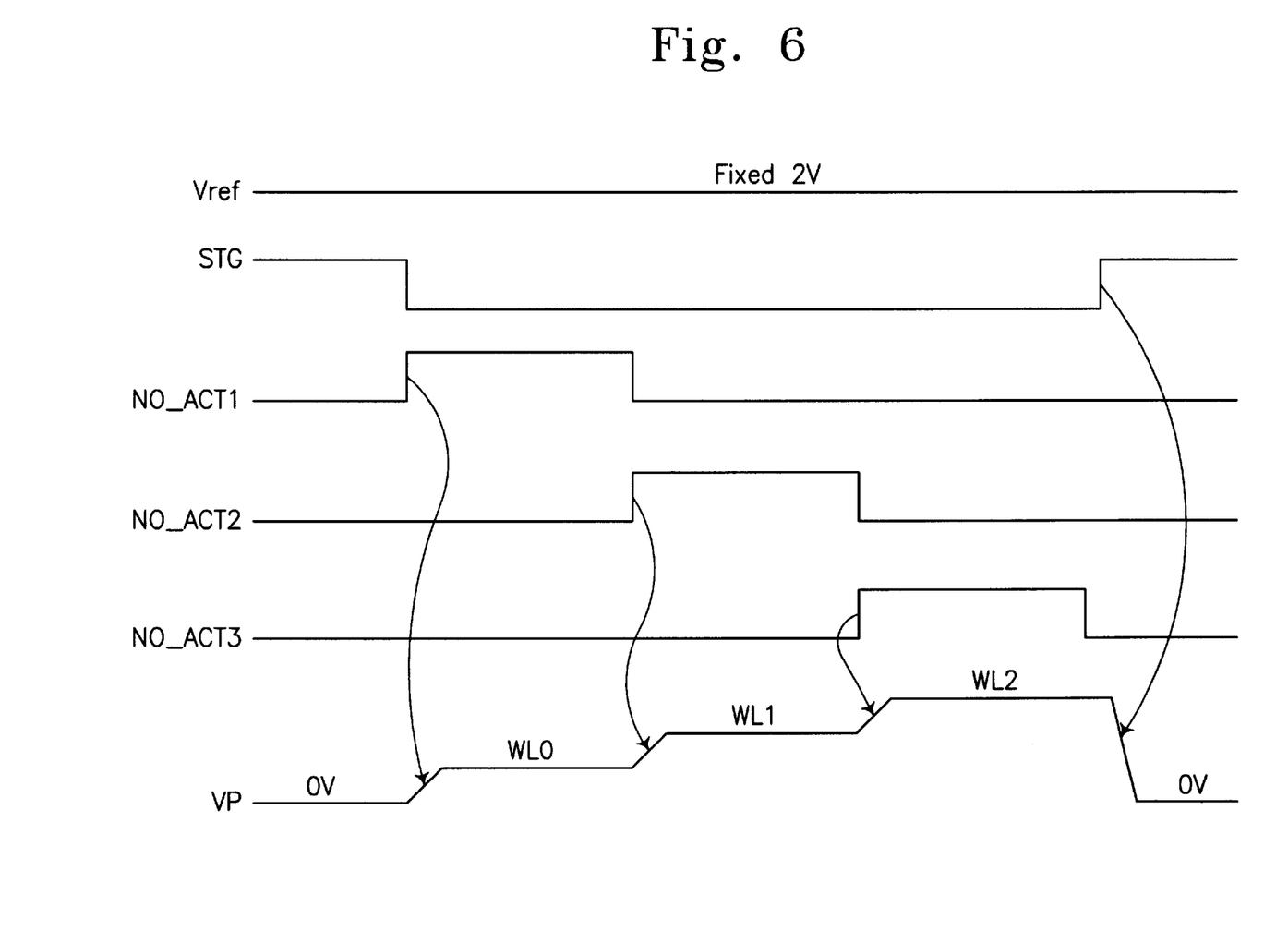
FIG. 6 is a timing diagram illustrating a word line voltage waveform produced by the word line voltage generator of FIG. 5.

FIG. 6 illustrates exemplary voltage waveforms that may be produced by the word line voltage generator 13-1 of FIG. 5. When the reset signal STG is at a "high" level, the voltage VP at the output terminal is approximately 0V, and the gates of the dummy cells M00, M01, M10 are pulled to signal ground through the NMOS transistor 58. Prior to a read operation, the select signals NO_ACT1, NO_ACT2 and NO_ACT3 are held at a "low" level, causing the transistors 51, 56 to conduct and the transistor 57 to block current flow such that node 5C is charged up to the power supply level VCC/VPP through the PMOS current mirror transistor 51 while current flow is blocked through the PMOS transistor 53. The memory cell referenced regulators 100a, 100b, 100c draw negligible current because of the high impedance presented by the transistor 57.

A data reading operation is initiated by taking the reset signal STG "low" and taking the first select signal NO_ACT1 "high" while the other select signals NO_ACT2, NO_ACT3 remain "low." This enables operation of the first memory cell referenced regulator 100a while the second and third memory cell referenced regulators 100b, 100c remain inactive. The PMOS transistor 51 of the first current mirror 110a is turned off, allowing the current mirror 110a to operate and conduct current through the NMOS transistors 56, 57. The gate potential of the PMOS transistor 53 begins to rise, allowing the output voltage VP at the output terminal ND1 to increase. As the output voltage VP increases, the gate potential of the dummy memory cell M00 also rises by means of the coupling capacitor 60, with a voltage Vg being produced that is proportional to a coupling ratio between the gate capacitance of the dummy memory cell M00 and the capacitance of the capacitor 60:

$$Vg = VP \times \frac{Ccap}{(Ccap + Ccel)}$$

where Ccap denotes the capacitance of the capacitor 60 and Ccel denotes the gate capacitance of the dummy cell M00.

As the node ND1 potential continues to increase, the gate voltage Vg applied to the gate of the dummy memory cell M00 approaches the threshold voltage Vth1 of the dummy memory cell M00, causing the dummy memory cell M00 to conduct. This lowers the voltage applied to the controlled impedance transistor 56 and increases its impedance, causing the voltage at the node 5C to increase. When this voltage approaches a level of VCC/VPP−Vtp (where Vtp is the threshold voltage of the current mirror transistor 52), the PMOS transistor 53 begins to turn off. That is, the current mirror 110a senses current flowing through the dummy cell M01, and produces a current at the output terminal ND1 responsive to the detected current. As a result, the output voltage VP is regulated to a level WL0 of approximately the dummy memory cell threshold voltage Vth1 plus an offset voltage. The offset voltage is determined by a coupling ratio and remains constant.

It will be understood that the second and third memory cell referenced regulators 100b, 100c operate in a similar fashion responsive to assertion of the second and third select signals NO_ACT 2, NO_ACT3, respectively. When the second select signal NO_ACT2 is taken "high" while the first and third select signals NO_ACT1, NO_ACT3 are held "low," the second memory cell referenced regulator 100b is activated, producing an output voltage VP that is regulated at a level WL1 of approximately the dummy memory cell threshold level Vth2 plus an offset. Similarly, when the third select signal NO_ACT3 is taken "high" while the first and second select signals NO_ACT1, NO_ACT3 are held "low," the third memory cell referenced regulator 100b is activated, producing an output voltage VP that is regulated at a level WL2 of approximately the dummy memory cell threshold level Vth3 plus an offset. And then, the signal NO_ACT1 is disabled at the low level, while the signal NO_ACT2 is activated at the high level, as shown in FIG. 6.

In each of the memory cell referenced regulators 100a, 100b, 100c, dummy memory cells M00, M01, M10 having respective first, second and third threshold voltages Vth1, Vth2 and Vth3 are provided. Although the threshold voltages of these dummy memory cells may vary due to process variation, they will tend to vary in a similar manner, allowing data reading to be reliably performed. The capacitances of the capacitors 60 in the regulators 100a, 100b, 100c preferably are equal so that an equal sensing margin is provide for each of the sensing voltages WL0, WL1, WL2. However, the sensing margins may be set differently from each other at each sensing operation by using different values for the capacitors 60.

Figure 7:
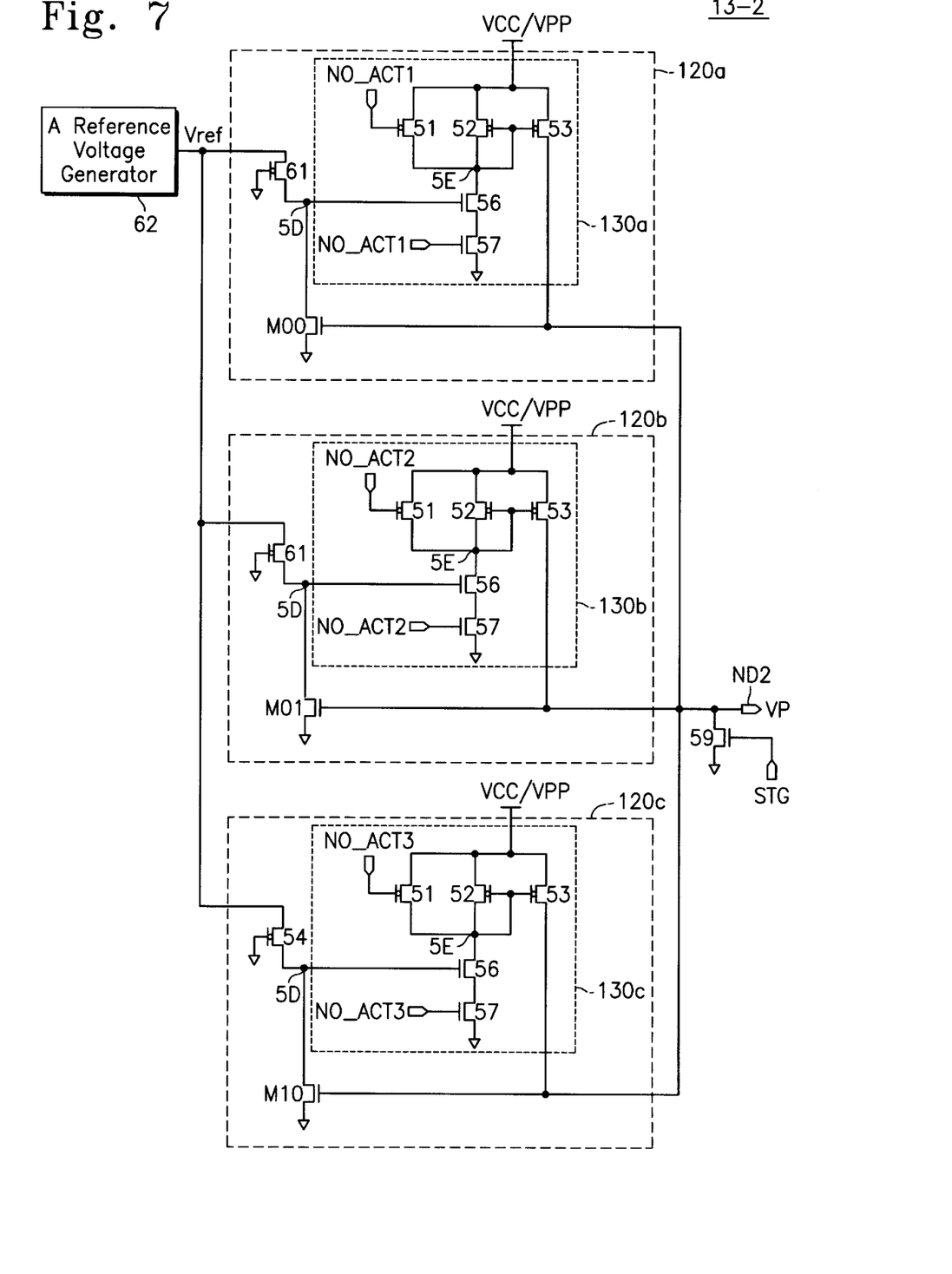
FIG. 7 is a schematic diagram illustrating a word line voltage generator according to a second embodiment of the present invention.

FIG. 7 is a circuit diagram of a word line voltage generator 13-2 for use in a multi-level memory device such as the memory device 1 of FIG. 3 according to a second embodiment of the present invention. The word line voltage generator 13-2 includes a reference voltage generator 62 and three memory cell referenced regulators 120a, 120b, 120c connected in common to an output terminal ND2 at which an output voltage VP is produced. A respective one of the memory cell referenced regulators 120a, 120b, 120c includes a respective variable current mirror 130*a*, 130*b*, 130*c* that is controlled by a respective control voltage generator 135*a*, 135*b*, 135*c* based on a respective threshold voltage Vth1, Vth2, Vth3 of a respective dummy memory cell M00, M01, M10. The word line voltage generator 13-2 of FIG. 7 differs from the word line voltage generator 13-1 of FIG. 5 in that the gates of the dummy memory cells M00, M01, M10 are directly connected to the output terminal ND2, and PMOS transistors 54 of the memory cell referenced regulators 120*a*, 120*b* and 120*c* serve as a resistor elements instead of pre-charge transistors.

The word line voltage generating circuit 13-2 of FIG. 7 may be operated in a similar fashion to the word line voltage generator 13-1 of FIG. 5, as described above in relation to FIG. 6. When the reset signal STG is "high", the output voltage VP is approximately 0V due to the action of the NMOS transistor 59. Prior to a read cycle, the select signals NO_ACT1, NO_ACT2, NO_ACT3 are held low, causing the PMOS transistors 51, 56 to conduct while the NMOS transistors 57 block current flow, so that nodes 5E of the memory cell referenced regulators 120*a*, 120*b*, 120*c* are charged up to the VCC/VPP level through the PMOS transistors 51 and current flow through the PMOS transistors 53 is blocked.

A read cycle is initiated when the reset signal STG is taken "low" and the first select signals NO_ACT1 is asserted "high" while the other select signals NO_ACT2, NO_ACT3 are held "low." This causes the first word line voltage generator 120*a* to be activated while the second and third word line voltage generators 120*b*, 120*c* remain inactive. Assertion of the first select signal NO_ACT1 "high" turns off the PMOS transistor 51 of the first memory cell referenced regulator 120*a*, and turns on the NMOS transistor 57 so that current flows from the node 5E to signal ground.

When the gate potential of the PMOS transistor 53 is pulled toward signal ground, the output voltage VP at the output terminal ND2 increases. As the output voltage VP exceeds the threshold voltage Vth1 of the dummy memory cell M00, the dummy memory cell M00 is turned on, causing the voltage applied to the controlled impedance transistor 56 to be lowered, increasing its impedance and lowering the current in the controlled current path of the current mirror 130*a*, and concomitantly, reducing the current flowing through the transistor 53. The current mirror 130*a* operates such that the transistor 53 is turned off when the voltage at node 5E is approximately VCC/VPP−Vtp (where Vtp is a threshold voltage of the transistor 52). The output voltage VP is regulated to a level WL0 that is approximately the threshold voltage Vth1 of the dummy memory cell M00 plus an offset.

It will be understood that the second and third memory cell referenced regulators 120*b*, 120*c* operate in a similar fashion responsive to assertion of the second and third select signals NO_ACT 2, NO_ACT3, respectively. When the second select signal NO_ACT2 is taken "high" while the first and third select signals NO_ACT1, NO_ACT3 are held "low," the second memory cell referenced regulator 120*b* is activated, producing an output voltage VP that is regulated at a level WL1 of approximately the dummy memory cell threshold level Vth2 plus an offset. Similarly, when the third select signal NO_ACT3 is taken "high" while the first and second select signals NO_ACT1, NO_ACT3 are held "low," the third memory cell referenced regulator 120*c* is activated, producing an output voltage VP that is regulated at a level WL2 of approximately the dummy memory cell threshold level Vth3 plus an offset.

The resistances of the PMOS transistor 54 in the regulators 120*a*, 120*b*, 120*c* preferably are equal so that an equal sensing margin is provided at each of the word line voltage levels WL0, WL1, WL2. However, the sensing margins may be set differently by using setting the transistors 54 to provide different resistances.

Figure 8:
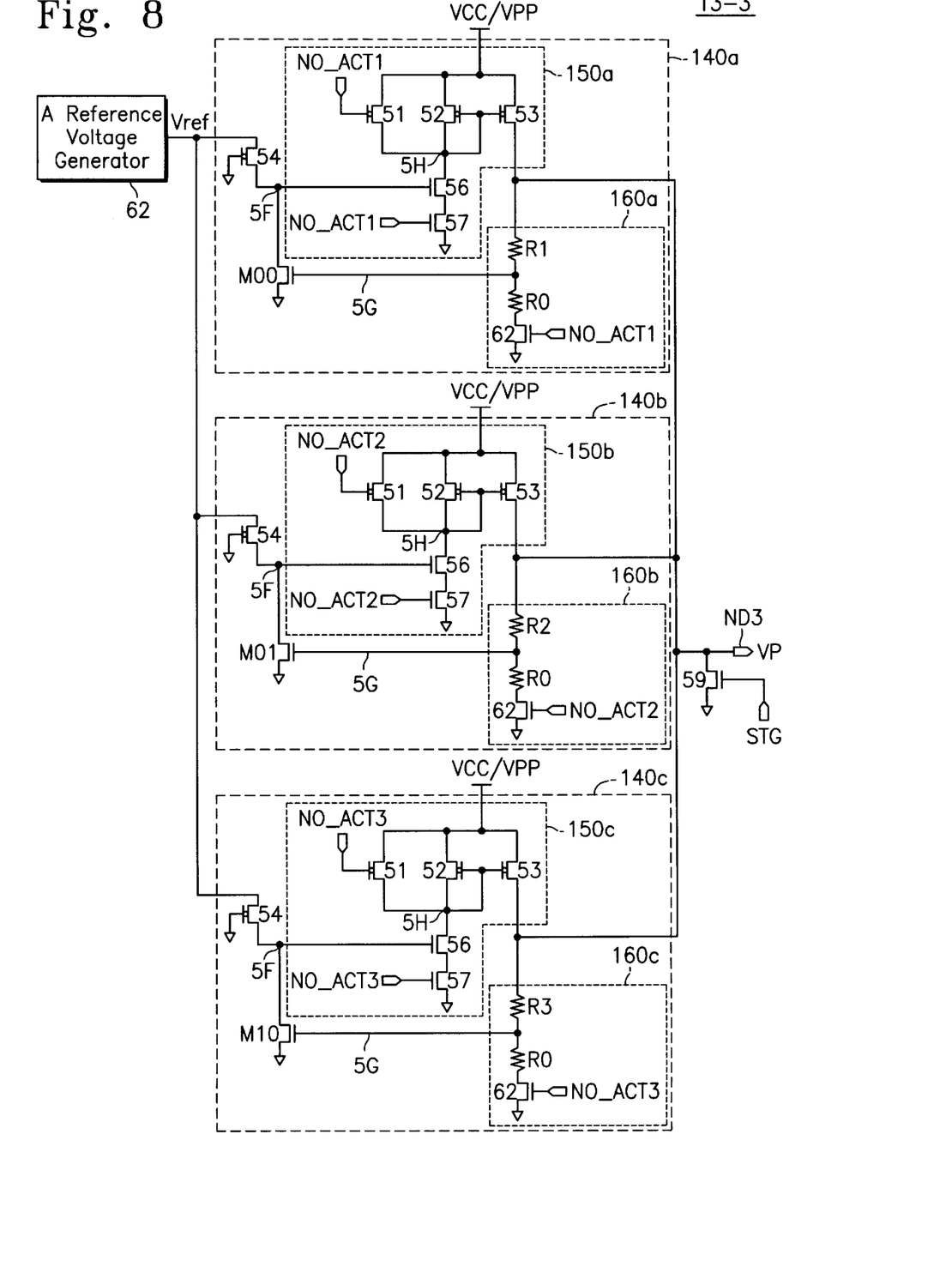
FIG. 8 is a schematic diagram illustrating a word line voltage generator according to a third embodiment of the present invention.

FIG. 8 is a circuit diagram of a word line voltage generator 13-3 for use in a multilevel memory device such as the device 1 of FIG. 3 according to a third embodiment of the present invention. The word line voltage generator 13-3 includes three memory cell referenced regulators 140*a*, 140*b*, 140*c*, which include respective variable current mirrors 150*a*, 150*b*, 150*c* that are responsive to control voltage generators 155*a*, 155*b*, 155*c* including dummy memory cells M00, M01, M10. The word line voltage generator 13-3 differs from the word line voltage generator 13-1 of FIG. 5 in that the output terminal ND3 is connected to the gates of the dummy memory cells M00, M01, M10 by voltage dividers 160*a*, 160*b*, 160*c*, a respective one of which includes a respective resistor combination R1/R0, R2/R0, R3/R0 connected to signal ground by an NMOS transistor 62 that is responsive to respective select signal NO_ACT1, NO_ACT2, NO_ACT3. As illustrated in FIG. 8, the resistors R0 of the voltage dividers 160*a*, 160*b*, 160*c* have the same resistance value, while the resistors R1, R2, R3 have differing values.

The word line voltage generating circuit 13-3 of FIG. 8 may be operated in a similar fashion to the word line voltage generator 13-1 of FIG. 5, as described above in relation to FIG. 6. When the reset signal STG is "high', the output voltage VP at the output terminal ND3 is approximately 0V. Prior to a read cycle, the select signals NO_ACT1, NO_ACT2, NO_ACT3 are held at a "low" level, such that the transistors 51 and 56 are turned and the transistor 57 is turned off, allowing the node 5E to be pulled up to the power supply voltage VCC/VPP through the PMOS transistor 51 and the PMOS transistor 53 to be turned off.

A read cycle is initiated when the reset signal STG is taken "low" and the first select signals NO_ACT1 is asserted "high" while the other select signals NO_ACT2, NO_ACT3 are held "low." This activates the first memory cell referenced regulator 140*a* while the second and third word line voltage generators 140*b*, 140*c* remain inactive. Assertion of the first select signal NO_ACT1 "high" causes the PMOS transistor 51 to turn off, and the NMOS transistor 57 to turn on, such that current may flow from the node 5H through the NMOS transistors 56, 57.

As the gate potential of the PMOS transistor 53 decreases, the output voltage VP at the output terminal ND3 increases. The increase in the output voltage VP increases the voltage applied to the gate of the dummy memory cell M00 through the action of the voltage divider 160*a*. As the voltage at node 5G of the voltage divider 160*a* is less than the output voltage VP, the dummy cell M01 remains turned off even when the output voltage VP exceeds the threshold voltage Vth1 of the dummy memory cell M00.

When the output voltage VP increases sufficiently, however, the gate voltage applied to the dummy memory cell M00 eventually becomes greater than the threshold voltage Vth1, causing the dummy memory cell M00 to conduct and reduce the voltage at the gate of the impedance controlling transistor 56 at node 5F. When this voltage falls below the threshold voltage of the transistor 56, the transistor 56 turns off, causing the voltage applied to the gate of the transistor 53 to increase and begin blocking current flow through the output terminal ND3. Therefore, the output voltage VP is regulated to a level WL0 that is approximately the threshold voltage Vth1 plus an offset voltage that is determined by the values of the resistors R0, R1 of the voltage divider 160a. Those skilled in the art will appreciate that the resistances of each resistor R1, R2, R3 in the memory cell reference regulators 140a, 140b, 140c are set so an equal sensing margins are provided, but the sensing margins can be set differently from each other by changing the values of the resistors R1, R2, R3.

It will be understood that the second and third memory cell referenced regulators 140b, 140c operate in a similar fashion responsive to assertion of the second and third select signals NO_ACT 2, NO_ACT3, respectively. When the second select signal NO_ACT2 is taken "high" while the first and third select signals NO_ACT1, NO_ACT3 are held "low," the second memory cell referenced regulator 140b is activated, producing an output voltage VP that is regulated at a level WL1 of approximately the dummy memory cell threshold level Vth2 plus an offset. Similarly, when the third select signal NO_ACT3 is taken "high" while the first and second select signals NO_ACT1, NO_ACT3 are held "low," the third memory cell referenced regulator 140c is activated, producing an output voltage VP that is regulated at a level WL2 of approximately the dummy memory cell threshold level Vth3 plus an offset.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. In a multi-level memory device including a plurality of memory cells, each of which has a programmable threshold voltage such that the memory cell produces a current in response to a word line voltage applied thereto, an apparatus for generating word line voltages comprising:

a plurality of memory cell referenced regulators connected to an output terminal that is configured to connect to the plurality of memory cells, a respective one of the memory cell referenced regulators including a respective dummy memory cell, wherein said plurality of memory cell referenced regulators are responsive to at least one select signal that selects one memory cell referenced regulator of said plurality of memory-cell referenced regulators and to an output voltage at said output terminal such that the selected one of said memory cell referenced regulators varies a current at said output terminal to maintain said output voltage at a voltage proportional to a predetermined threshold voltage of the dummy memory cell of the selected memory cell referenced regulator.

2. An apparatus according to claim 1, wherein each of said memory cell referenced regulators comprises:

a variable current mirror having a controlled current path and an output current path including said output terminal, said controlled current path having a controlled impedance therein that provides a variable impedance responsive to a control voltage applied thereto such that current produced at said output terminal is proportional to current in said controlled current path; and a control voltage generator connected between said output terminal and said controlled impedance and including a dummy memory cell having a predetermined threshold voltage, said control voltage generator operative to apply a control voltage to said controlled impedance to vary a current at said output terminal when an output voltage at said output terminal is greater than a predetermined voltage proportional to said predetermined threshold voltage of said dummy memory cell.

3. An apparatus according to claim 2, wherein said controlled impedance comprises a transistor having first and second controlled electrodes in said controlled current path and a control electrode connected to said memory cell biased control voltage generator.

4. An apparatus according to claim 2, wherein said control voltage generator comprises:

a dummy memory cell transistor having a control electrode electrically coupled to said output terminal and a controlled electrode connected to said controlled impedance, wherein said dummy memory cell is operative to vary a control voltage applied to said controlled impedance when a voltage at said control electrode is greater than said predetermined threshold voltage.

5. An apparatus according to claim 4, further comprising a capacitor coupling said control electrode of said dummy memory cell transistor and said output terminal.

6. An apparatus according to claim 4, further comprising:

a first resistor coupling said control electrode of said dummy memory cell transistor to said output terminal; and a second resistor coupling said control electrode of said dummy memory cell transistor to a signal ground.

7. An apparatus according to claim 4, wherein said control voltage generator comprises:

a dummy memory cell transistor having a control electrode electrically coupled to said output terminal, a first controlled electrode coupled to said controlled impedance, and a second controlled electrode connected to a signal ground;

an impedance configured to receive a reference voltage and coupled to said first controlled electrode of said dummy memory cell transistor.

8. An apparatus according to claim 7, wherein said impedance comprises a transistor having a first controlled electrode configure to receive a reference voltage, a second controlled electrode connected to said first controlled electrode of said dummy memory cell transistor, and a control electrode connected to a signal ground.

9. An apparatus according to claim 2:

wherein said variable current mirror comprises:

a first transistor having a first controlled electrode connected to said controlled impedance, a second controlled electrode, and a control electrode;

a second transistor having a control electrode connected to said control electrode of said first transistor, a first controlled electrode connected to said output terminal, and a second controlled electrode connected to said second controlled electrode of said first transistor; and wherein each of said memory cell referenced regulators further comprises:

a first switch connected in series with said first and second controlled electrodes of said first transistor and with said controlled impedance and operative to allow and prevent current flow in said controlled current path responsive to an select signal applied thereto; and a second switch connected between said first and said second controlled electrodes of said first transistor and operative to enable and disable operation of said current mirror circuit responsive to said select signal.

10. An apparatus according to claim 9, wherein said first and second switches comprise transistors having respective control electrodes configured to receive said select signal.

11. An apparatus according to claim 9, further comprising a third switch connected between said output terminal and a signal ground and operative to allow and prevent current flow from said word line voltage generator to the plurality of memory cells responsive to a reset signal applied thereto.

12. An apparatus according to claim 11, wherein said third switch comprises a transistor having a control electrode configured to receive said reset signal.

13. A multi-level memory device, comprising:
a plurality of memory cells, each of said memory cells having a programmable threshold voltage such that the cell produces a current in response to a word line voltage applied thereto;
a word line voltage generator including a plurality of memory cell referenced regulators coupled to an output terminal, a respective one of the memory cell referenced regulators including a respective dummy memory cell, wherein said plurality of memory cell referenced regulators are responsive to at least one select signal that selects one memory cell referenced regulator of said plurality of memory cell referenced regulators and to an output voltage at said output terminal such that the selected one of said memory cell referenced regulators varies a current at said output terminal to maintain said output voltage at a voltage proportional to a predetermined threshold voltage of the dummy memory cell of the selected memory cell referenced regulator; and
a word line decoder operative to connect said output terminal of said word line voltage generator to a memory cell of said plurality of memory cells.

14. A memory device according to claim 13, wherein each of said memory cell referenced regulators comprises:
a variable current mirror having a controlled current path and an output current path including said output terminal, said controlled current path having a controlled impedance therein that provides a variable impedance responsive to a control voltage applied thereto such that current produced at said output terminal is proportional to current in said controlled current path; and
a control voltage generator connected between said output terminal and said controlled impedance and including a dummy memory cell having a predetermined threshold voltage, said control voltage generator operative to apply a control voltage to said controlled impedance to vary a current at said output terminal when an output voltage at said output terminal is greater than a predetermined voltage proportional to said predetermined threshold voltage of said dummy memory cell.

15. A memory device according to claim 14, wherein said control voltage generator comprises:
a dummy memory cell transistor having a control electrode electrically coupled to said output terminal and a controlled electrode connected to said controlled impedance, wherein said dummy memory cell is operative to vary a control voltage applied to said controlled impedance when a voltage at said control electrode is greater than said predetermined threshold voltage.

16. A memory device according to claim 14:
wherein said variable current mirror comprises:
a first transistor having a first controlled electrode connected to said controlled impedance, a second controlled electrode, and a control electrode;
a second transistor having a control electrode connected to said control electrode of said first transistor, a first controlled electrode connected to said output terminal, and a second controlled electrode connected to said second controlled electrode of said first transistor; and
wherein each of said memory cell referenced regulators further comprises:
a first switch connected in series with said first and second controlled electrodes of said first transistor and with said controlled impedance and operative to allow and prevent current flow in said controlled current path responsive to an select signal applied thereto; and
a second switch connected between said first and said second controlled electrodes of said first transistor and operative to enable and disable operation of said current mirror circuit responsive to said select signal.

17. A memory device according to claim 16, further comprising a third switch connected between said output terminal and a signal ground and operative to allow and prevent current flow from said word line voltage generator to said word line decoder.

18. A memory cell referenced regulator for producing a read voltage for a multi-level memory device including a plurality of multilevel memory cells, the regulator comprising:
a dummy memory cell having a predetermined threshold voltage;
an output terminal; and
means, responsive to a select signal and to an output voltage at said output terminal, for varying a current at said output terminal such that the output voltage is maintained at a voltage proportional to the threshold voltage of said dummy memory cell.

19. A regulator according to claim 18, comprising:
a variable current mirror having a controlled current path and an output current path including said output terminal, said controlled current path having a controlled impedance therein that provides a variable impedance responsive to a control voltage applied thereto such that current produced at said output terminal is proportional to current in said controlled current path; and
a control voltage generator connected between said output terminal and said controlled impedance and including a dummy memory cell having a predetermined threshold voltage, said control voltage generator operative to apply a control voltage to said controlled impedance to vary a current at said output terminal when an output voltage at said output terminal is greater than a predetermined voltage proportional to said predetermined threshold voltage of said dummy memory cell.

20. A regulator according to claim 19, wherein said controlled impedance comprises a transistor having first and second controlled electrodes in said controlled current path and a control electrode connected to said memory cell biased control voltage generator.

21. A regulator according to claim 19, wherein said controlled impedance comprises a transistor having first and second controlled electrodes in said controlled current path and a control electrode connected to said memory cell biased control voltage generator.

22. A regulator according to claim 19, wherein said control voltage generator comprises:
a dummy memory cell transistor having a control electrode electrically coupled to said output terminal and a controlled electrode connected to said controlled impedance, wherein said dummy memory cell is operative to vary a control voltage applied to said controlled impedance when a voltage at said control electrode is greater than said predetermined threshold voltage.

23. A regulator according to claim 22, further comprising a capacitor coupling said control electrode of said dummy memory cell transistor and said output terminal.

24. A regulator according to claim 22, further comprising:
- a first resistor coupling said control electrode of said dummy memory cell transistor to said output terminal; and
- a second resistor coupling said control electrode of said dummy memory cell transistor to a signal ground.

25. A regulator according to claim 22, wherein said control voltage generator comprises:
- a dummy memory cell transistor having a control electrode electrically coupled to said output terminal, a first controlled electrode coupled to said controlled impedance, and a second controlled electrode connected to a signal ground;
- an impedance configured to receive a reference voltage and coupled to said first controlled electrode of said dummy memory cell transistor.

26. A regulator according to claim 22, wherein said impedance comprises a transistor having a first controlled electrode configured to receive a reference voltage, a second controlled electrode connected to said first controlled electrode of said dummy memory cell transistor, and a control electrode connected to a signal ground.

* * * * *